United States Patent [19]

Eisenberg

[11] Patent Number: 4,939,485

[45] Date of Patent: Jul. 3, 1990

[54] MICROWAVE FIELD EFFECT SWITCH

[75] Inventor: John A. Eisenberg, Los Altos, Calif.

[73] Assignee: Varian Associates, Inc., Palo Alto, Calif.

[21] Appl. No.: 282,181

[22] Filed: Dec. 9, 1988

[51] Int. Cl.$^5$ .................................................. H01P 1/15
[52] U.S. Cl. .................................... 333/104; 333/247; 333/262; 357/22
[58] Field of Search ............... 333/103, 104, 246, 247, 333/262; 357/22 H, 22 I, 22 J

[56] References Cited

U.S. PATENT DOCUMENTS 3,969,745 7/1976 Blocker, III ..................... 357/22 I
4,733,203 3/1988 Ayasli .............................. 333/103 X

FOREIGN PATENT DOCUMENTS 145166 8/1983 Japan ................................. 357/22 I
67802 3/1988 Japan ................................. 333/103

OTHER PUBLICATIONS

*GaAs MMIC SPDT Broadband FET Switch*, M/A-Com Advanced Semi-Conductor Operations, Product Feature, Microwave Journal, p. 364, May '86.
Bharj et al, *MESFET Switch Design*, MSN&CT, Nov. 1987, pp. 76, 79, 81-86.
Pengelly, *Using GaAs MMICs as Control Devices*, MSN, Apr. 1989, pp. 18-20, 22, 23, 26-28.

*Primary Examiner*—Paul Gensler
*Attorney, Agent, or Firm*—Stanley Z. Cole; Gerald M. Fisher; David Schnapf

[57] ABSTRACT

A monolithic microwave integrated circuit switch includes a series field effect transistor having a source drain path in series with an inductive transmission line including plural taps. Source drain paths of plural shunt field effect transistors are connected to the taps. The source drain paths of the series and shunt transistors are biased so that the series and shunt source drain paths have complementary low and high impedance states. The high impedance state is capacitive, having a value on the order of magnitude of the inductive transmission line. During a first time interval, the capacitive and inductive impedances form a matched low pass filter to supply current from a microwave source to a load. During a second time interval, current from the microwave source flows through the shunt field effect transistors to be decoupled from the load. The circuit is in stripline form, with source electrodes of field effect transistors including first and second arms respectively having first and second elongated parallel sides. First and second elongated edges of drain electrodes of the transistors extend parallel to the elongated sides. A gate electrode of each transistor includes first and second elongated fingers respectively extending parallel the elongated sides and edges. The first finger is between the first side and first edge; the second finger is between the second side and second edge.

18 Claims, 8 Drawing Sheets

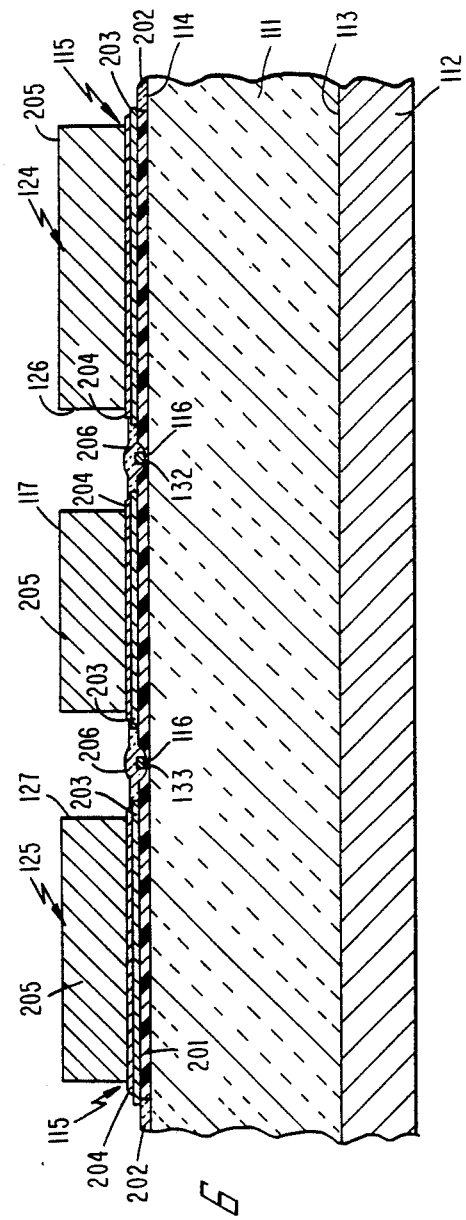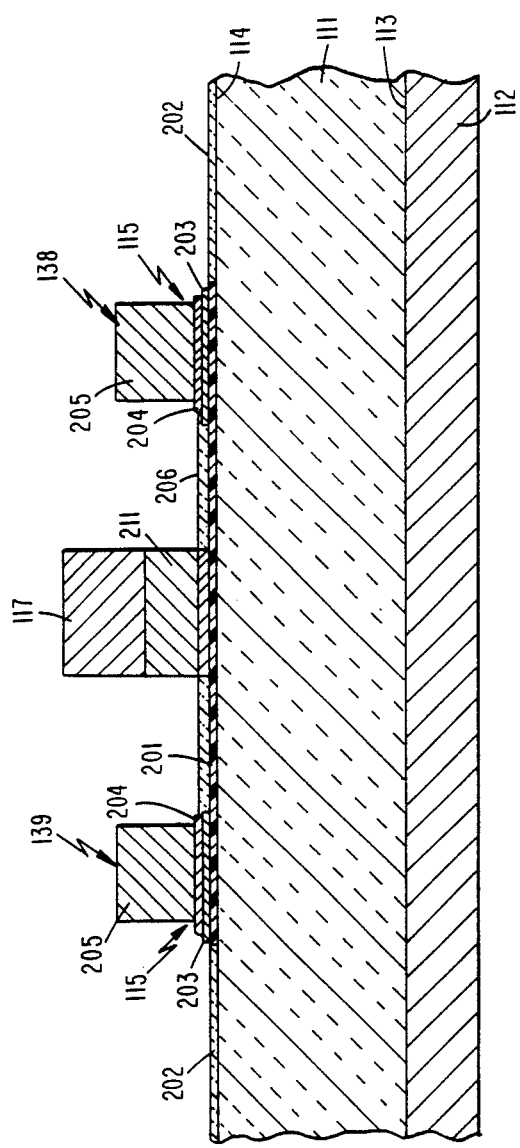

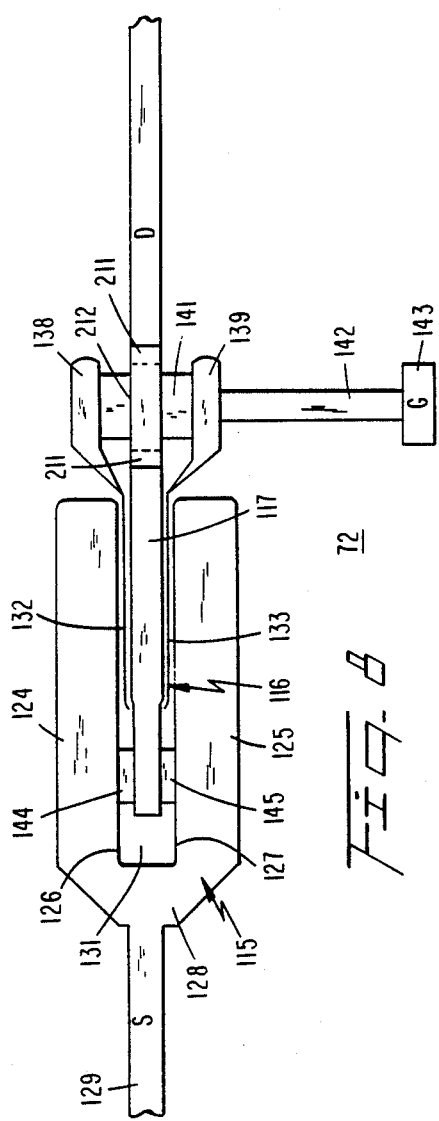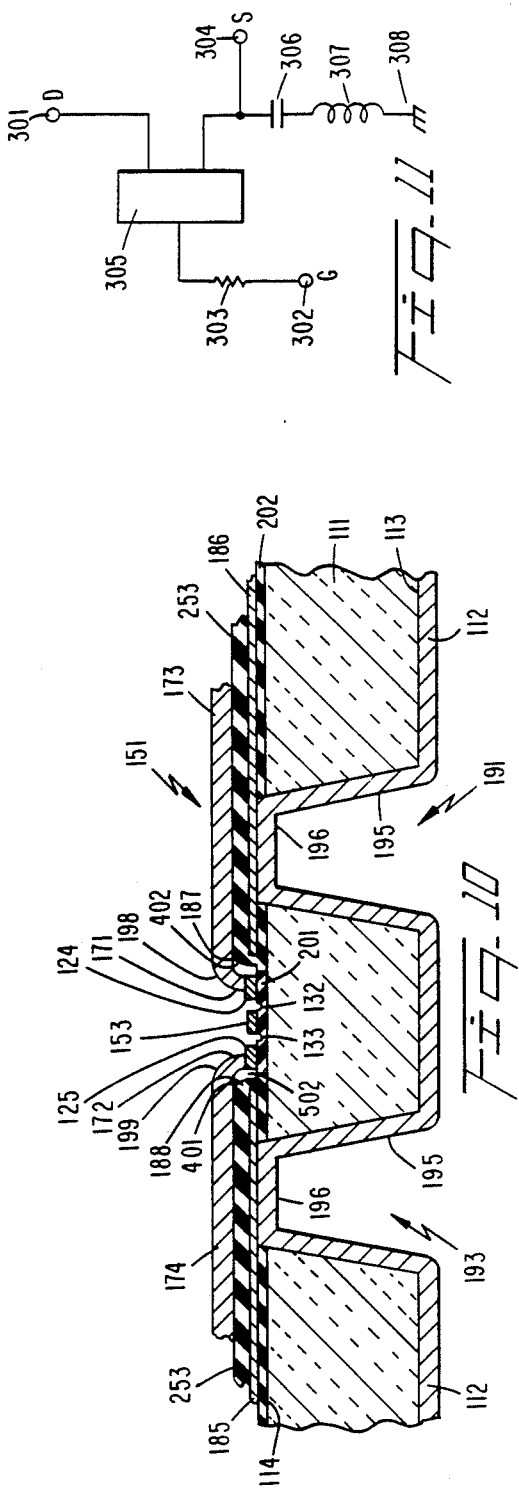

MICROWAVE FIELD EFFECT SWITCH

FIELD OF THE INVENTION

The present invention relates generally to microwave switches and more particularly to a microwave switch including a network of shunt field effect transistors selectively biased to a relatively low impedance state and a higher impedance capacitive state to form a component of a matched low pass filter. In accordance with another aspect of the present invention, a microwave stripline field effect transistor includes a source electrode having two parallel, spaced arms between which are located a pair of gate fingers and an elongated drain strip.

BACKGROUND ART

A prior art microwave switch includes an inductance or high impedance transmission line used as an inductance connected in series between a microwave source and a microwave load; the inductive transmission line has N taps, where N is an integer greater than 1. N shunt diodes are provided, such that one diode is connected to each of the taps. To couple the microwave signal to the load, the diodes are back biased to form capacitive impedances of a low pass filter including the inductane; the filter has a cut off frequency sufficiently high to pass all frequencies in a microwave pass band of interest. To decouple the microwave signal from the load, the diodes are forward biased to provide low impedance paths between the taps of the inductive transmission line and ground.

A problem with this microwave switch is that driver circuitry for the diode requires a significant amount of power to rapidly forward and back bias the diodes. Although it is desirable for the driver to be realized in the same integrated circuit structure as the microwave switch, the driver power dissipation can adversely affect switch utility for many applications.

A microwave switch specification calls for an ON state insertion loss less than 3 db and an OFF state isolation in excess of 48 db over a 0.1-20 gHz frequency range. It is also desirable for such switches to be able to handle a relatively high amount of microwave power, such as 100 milliwatts, and to switch from a fully on to a fully off condition in less than 15 nanoseconds.

It is, accordingly, an object of the present invention to provide a new and improved microwave switch.

Another object of the present invention is to provide a new and improved single pole double throw microwave switch.

A further object of the invention is to provide a microwave switch which, while activated to the on and off states, draws virtually no power from a driver.

A further object of the invention is to provide a new and improved high power, high speed microwave switch having a relatively low on state insertion loss and relatively high off state isolation.

Still another object of the invention is to provide a new and improved microwave structure wherein a switch driver and a switch are realized in a monolithic integrated circuit structure.

THE INVENTION

In accordance with one aspect of the present invention, the foregoing objects are achieved with a first field effect device having a source drain path in series between a microwave signal source and a microwave load and with N second field effect devices each having a shunt source drain path. An inductive transmission line in series with the source drain path of the first field effect device and the load includes N taps, each connected to one of the N second field effect devices. The source drain paths of the first and second field effect devices are biased so that during a first time interval the source drain paths of the first device and the N second devices respectively have first and second impedance states. During a second time interval the source drain paths of the first and N second field effect devices are biased so that they respectively have the second and first impedance states. The first impedance state is a low resistive impedance. The second impedance state is a high capacitive impedance having a magnitude for the frequencies of the microwave signal approximately on the order of magnitude of the impedance of the inductive transmission line. During the first time interval the capacitive impedances of the N second field effect devices and the inductive transmission line form a matched low pass filter having a cut off frequency in excess of the highest frequency in the band, enabling a signal from the source to flow with low insertion loss through the first field effect device to the load. During the second time interval, the N second field effect devices shunt current of the source flowing in the inductive transmission line away from the load to decouple the load from the source.

The switch structure can be configured as a single pole, double throw switch or as a single pole, single throw switch. In the single pole, multi-throw configuration, the signal is selectively applied to one of M loads, where M is an integer greater than 1. In such a situation, M of said switches are connected to be driven in parallel by the microwave signal source. The qth one of said switches is connected to the qth one of the M loads, where q is selectively every integer from 1 to M. At any one time the source drain paths of the first and second devices of only switch q are biased to the first and second impedance states.

A further feature of the invention, which reduces voltage standing wave ratio (VSWR) of the switch while it is in the OFF or signal blocking state, is the inclusion of a third field effect device having a source drain path connected in series between the inductive transmission line of each switch and the load for that switch. A resistor equal in value to the load resistance is connected from source to drain of the third field effect device. The source drain path of the third field effect device is biased into the first and second states simultaneously with activating the source drain path of the first field effect device of the particular switch into the first and second states, respectively.

To minimize power requirements of field effect devices in driver circuitry for the switch, the field effect devices are Schottky barrier devices, each having a gate electrode that, in the first state, is zero biased into the region of triode operating characteristics and, in the second state, is back biased. While the field effect devices either have low source-drain resistance in the triode operating region or are pinched off, no bias current is supplied to them. Bias voltage is supplied to the devices to switch them between the triode and back bias or pinched off conditions. Hence, the driver circuit need supply power to the microwave field effect devices only while the devices are being switched between the first and second states.

To assist in maximizing the isolation of the switch when it is activated to the OFF condition, the distance between adjacent taps of the inductive transmission line is preferably λ/4, where λ is the wavelength of the highest frequency in the microwave band handled by the switch.

In accordance with a further aspect of the invention, an improved microwave field effect stripline structure including the switch is provided. The stripline structure comprises a semi-insulating substrate having first and second opposed faces on which are respectively formed a metal ground plane conductor and an active semiconductor region. The source electrode includes first and second arms respectively having first and second spaced elongated sides extending in generally the same direction. The drain electrode includes a single elongated strip extending between spaced elongated sides. The single strip includes first and second elongated edges extending in generally the same direction as the elongated sides. The gate electrode includes first and second elongated fingers extending in generally the same direction as the elongated sides and edges. The first finger is between the first side and first edge, while the second finger is between the second side and second edge. By utilizing a single drain electrode, rather than an interdigitated drain electrode with plural strips that are inductively and capacitively coupled to plural source arms and plural gate fingers, there is a significant reduction in parasitic reactance which improves the high frequency performance of the Schottky barrier field effect device.

The described microwave field effect stripline structure is configured as a series device in a first embodiment and as a shunt device in a second embodiment. The series and shunt devices respectively have source drain paths in series and shunt between a signal source and load.

In the series embodiment, the source electrode includes a body region connecting the first and second arms together and to another elongated strip. The arms and another elongated strip extend in opposite directions away from the body region. The strip included in the drain extends out of a region between the arms away from the body region.

The gate electrode includes first and second pad regions respectively connected to the first and second fingers and contact means for electrically connecting the two pad regions together. The contact means may comprise resistive material to enhance electrical isolation between the drain and gate electrodes. Since the field effect device is operated so that the source drain path thereof is either pinched off or in the triode region (the gate electrode draws no current in either event), both fingers of the gate electrode are at the same voltage, resulting in equal electrostatic fields between the two source arms, the two gate fingers and the center drain strip. This is true even though the gate voltage is applied directly to only one of the pads. In one embodiment the connection to the drain electrode between the two gate pads is established by a so-called metal strip air bridge over the connecting means for electrically connecting the two gate pads.

The shunt microwave field effect stripline structures are configured so that the elongated drain strip connecting the load and microwave source in series with each other extends beyond opposite ends of the parallel sides of the first and second arms. The source arms are configured as pads reactively coupled to the ground plane by an inductance and capacitance which are effectively series connected with each other and have very low impedance over the operating frequency range of the microwave field effect stripline structure. To these ends, a pair of electrically conductive pads is deposited on the substrate directly below the location where the pads forming the arms of the source electrode are to be deposited. Dielectric layer means is deposited on the pads on the substrate. The source arm pads are deposited on the dielectric layer means. Plated via holes connect the ground plane directly to each of the pads deposited directly on the substrate. Preferably, plural plated via holes extend through the substrate from the ground plane to each of the pads deposited directly on the substrate to reduce the inductive reactance of the via holes. The area of the source pad arms is large enough to provide sufficient capacitive coupling and thus a low impedance between the pads deposited directly on the substrate and the pads forming the source electrode. The stated arrangement provides DC isolation between the source electrode and the ground plane, while minimizing the impedance from the source electrode to ground at the operating frequency of the microwave field effect stripline structure.

It is, accordingly, still another object of the invention to provide a new and improved microwave field effect stripline structure.

It is an additional object of the invention to provide a new and improved microwave field effect stripline structure having a small amount of parasitic impedance so that it has high performance operating characteristics.

A further object of the present invention is to provide a new and improved microwave field effect Schottky barrier stripline structure having a source drain path connected in series with a load and microwave source and configured in such a way as to minimize parasitic reactance of the structure.

A further object of the present invention is to provide a new and improved microwave stripline Schottky barrier field effect structure having a source drain path connected in shunt with a microwave source and/or load.

A further object of the invention is to provide a new and improved microwave field effect Schottky barrier stripline structure having a source drain path connected in shunt with a microwave source and/or load and configured so that the source drain path is DC isolated from a ground plane and is coupled to the ground plane by a reactive network having very low impedance at the stripline structure microwave operating frequencies.

The above and still further objects, features and advantages of the present invention will become apparent upon consideration of the following detailed description of several specific embodiments thereof, especially when taken in conjunction with the accompanying drawings.

BRIEF DESCRIPTION OF THE DRAWINGS

FIG. 6 is a side sectional view taken through the lines 6—6 of FIG. 5;

FIG. 7 is a side sectional view taken through the lines 7—7 of FIG. 5;

FIG. 8 is a top view of a series Schottky barrier field effect transistor utilized in the circuit of FIG. 3;

FIG. 10 is a side sectional view taken through the lines 10—10, FIG. 9;

FIG. 11 is a circuit diagram of the structure illustrated in FIGS. 9 and 10;

DESCRIPTION OF THE PREFERRED EMBODIMENTS

Figure 1:
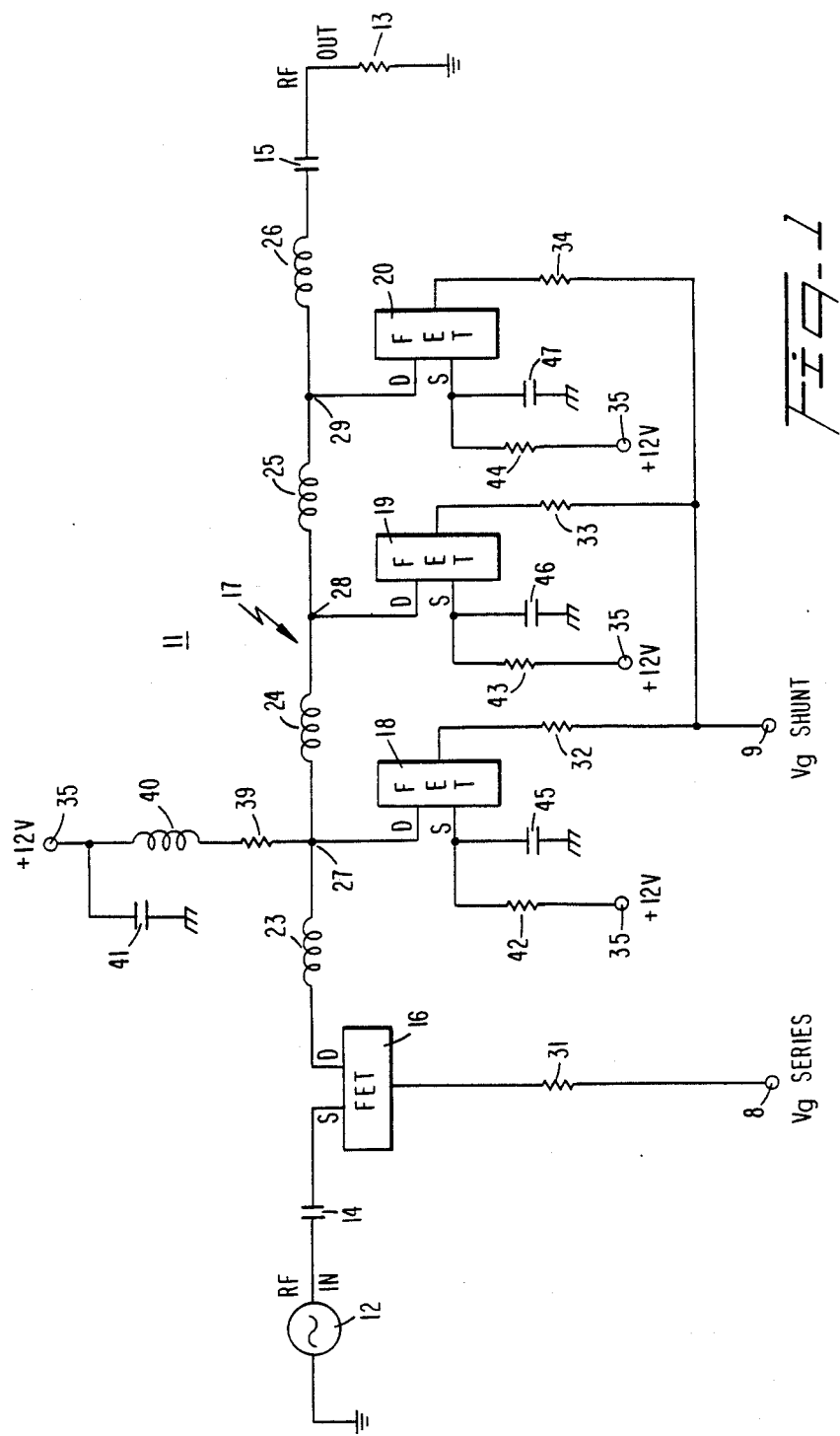
FIG. 1 is a circuit diagram of a series, distributed-shunt high isolation, single pole, single throw switch in accordance with the invention.

Reference is now made to FIG. 1 of the drawings wherein a series, distributed-shunt high isolation, single pole, single throw switch 11 is schematically shown connected between a wide band microwave source 12, typically having a frequency in the range of between 0.1 and 20 gHz, and a microwave load 13. Although not shown, source 12 includes a voltage generator in series with a source resistance equal in value to the characteristic impedance of the system, in a typical embodiment, approximately 50 ohms. Source 12 and load 13 are respectively capacitively coupled to switch 11 by series capacitors 14 and 15, having very low impedances at the microwave frequencies of source 12.

Figure 5:
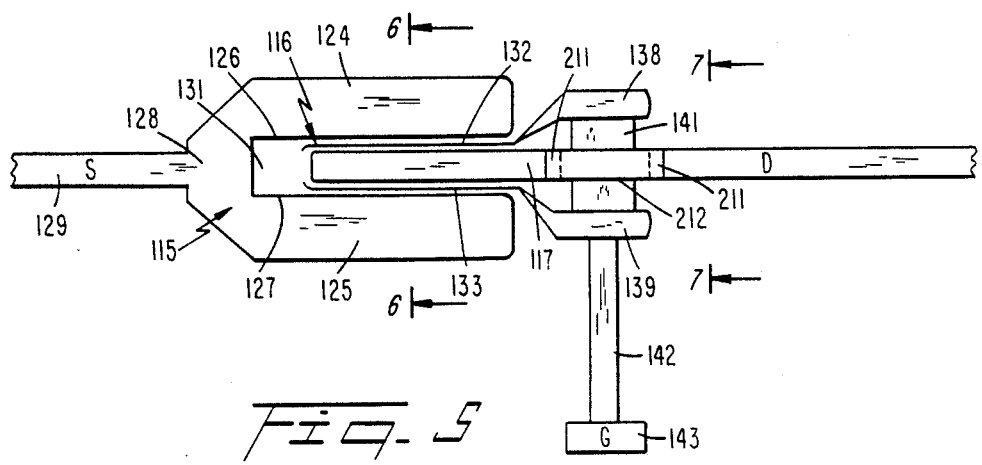
FIG. 5 is a top view of a series Schottky barrier field effect transistor utilized in any of the circuits of FIGS. 2-3.

Switch 11 includes series field effect device 16, series tapped inductive transmission line 17 and shunt field effect devices 18, 19 and 20. Field effect devices 16 and 18-20 are Schottky barrier transistors capable of handling the frequencies of source 12 with a minimum amount of attenuation when a zero bias voltage is applied between the source and gate electrodes of device 16 and a reverse bias voltage is applied between the source and gate electrodes of devices 18-20. A specific preferred configuration for device 16 is illustrated in FIGS. 5-7 and for each of devices 18 and 20 in FIGS. 8-10.

Figure 12:
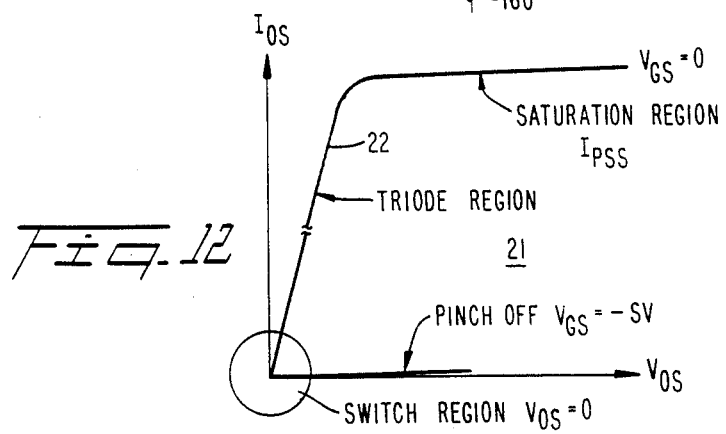
FIG. 12 is a graph of the source drain current characteristic curves of the field effect devices illustrated in FIGS. 1-3 and 5-10.

While a zero gate source bias voltage is applied to devices 16 and 18-20, the devices are biased to operate in triode region 22 (FIG. 12) of the drain source voltage-current characteristic curve 21 thereof. In triode region 22, the source drain impedance of devices 16 and 18-20 is predominantly resistive and can be represented as a small (approximately 4 ohm) resistance. In response to a negative voltage level (e.g. −6 volts) gate source back bias being applied to devices 16 and 18-20, the source drain path of each of devices 16 and 18-20 is effectively a series capacitance, having a value on the same order of magnitude as the inductive impedance of the inductive transmission line 17 for the frequencies of source 12.

While elements 18-20 are back biased they form, with series inductive transmission line 17, a low pass filter matched to the resistance of the source 12 and load 13 having a cut-off frequency greater than the highest frequency of source 12. The matched low pass filter including series inductive transmission line 17 and back biased shunt field effect transistors 18-20 has a very low insertion loss between source 12 and load 13; typically, the loss inserted between the source and load is less than 3 db over the 0.1-20 gHz range of source 12. As the frequency of source 12 increases, the reactance of inductive transmission line 17 increases while the capacitive, back biased impedances of transistors 18-20 decrease so the impedance match between the source 12 and load 13 stays substantially constant over the 0.1-20 gHz range.

Series inductive transmission line 17 is schematically shown as including inductors 23-26, arranged so that: tap 27 is between adjacent inductors 23 and 24, tap 28 is between adjacent inductors 24 and 25, and tap 29 is between inductors 25 and 26. Each of inductors 24 and 25 has an inductance about twice as large as the inductance of inductors 23 and 26. Thereby, half the inductance of inductor 24, in combination with the inductance of inductor 23 and the shunt, back biased source drain capacitance of field effect transistor 18 form a first low pass filter T section; half of the inductance of each of inductors 24 and 25, and the shunt, back biased capacitive impedance of field effect transistor 19 form a second low pass filter T section, while the third and final low pass filter T section is formed by half of the inductance of inductor 25, the inductance of inductor 26 and the back biased source drain capacitive impedance of field effect transistor 20.

The gate source junction of transistor 16 is biased oppositely from the gate source junctions of transistors 18-20. The source drain path of transistor 16 is biased for triode operation while the source drain paths of transistors 18-20 are pinched off and vice-versa. When there is a relatively low source drain impedance for transistor 16, the source drain impedances of transistors 18-20 are capacitive, and vice versa.

To these ends, a driver (described in conjunction with FIG. 4) supplies complementary signals to the gate electrode of transistor 16 and in parallel to the gate electrodes of transistors 18-20 by way of coupling resistors 31-34, respectively. The source drain paths of transistors 16 and 18-20 are biased so that in response to a +12 volt level being applied to resistor 31 via terminal 8 while a +6 volt level is applied via terminal 9 to resistors 32-34, transistor 16 is biased into the triode operating region, while transistors 18-20 are pinched off. Conversely, in response to a +6 volt level being applied to resistor 31 while a +12 volt level is applied to resistors 32-34, transistor 16 is pinched off and transistors 18-20 are biased into the triode region.

The source drain paths of transistors 16 and 18-20 are energized by supplying equal DC power supply voltage levels to biasing networks for the source and drain electrodes of transistors 18-20. In the preferred embodiment, a +12 volt DC voltage level is applied to the biasing networks by way of terminal 35. Tap 27 is connected to terminal 35 by way of the series combination of resistor 39 and rf choke 40; the connection of choke 40 to power supply terminal 35 is shunted to power supply ground by filter capacitor 41. Substantially equal DC power supply voltages from terminal 35 are supplied in parallel to the drains of transistors 16, 18, 19 and 20 via tap 27 because of the negligible DC impedance of inductors 23-25 between tap 27 and the drain electrodes of transistors 16, 19 and 20. Source electrodes of transistors 18-20 are connected to terminal 35 by way of resistors 42-44, respectively. Preferably, each of resistors 39 and 42-44 has the same value so transistors 16 and 18-20 have the same back bias and triode characteristics. The DC source drain resistance of transistor 16 is sufficiently low to enable the source thereof to be at about the same voltage as the drain of transistor 16.

In operation, in response to transistor 16 being biased into its triode region while transistors 18-20 are back biased and pinched off, the signal of source 12 is passed with minimum attenuation through the source drain path of transistor 16 to the low pass filter including inductors 23-26 and the capacitive reactances of the source drain paths of transistors 18-20. Inductors and rf chokes in the preferred embodiment may be realized as short lengths of high characteristic impedance transmission lines. The lengths of these lines shown as inductors 24 and 25 in FIG. 1 preferably approach one quarter wavelength ($\lambda/4$) at the highest frequency of operation of source 12. In the preferred embodiment, the signal of source 12 is coupled to load 13 with a very low insertion loss of less than 3 db and with a very low standing wave ratio, achieved, inter alia, because the values of inductors 23-26 in concert with the capacitances of pinched off transistors 18-20 form a matched low pass filter with a cut-off frequency greater than the highest frequency of source 12.

In response to the source drain path of switch 16 being pinched off while the source drain paths of transistors 18-20 are biased into their triode region of operation, the signal of source 12 is capacitively coupled by way of transistor 16 to the source drain paths of transistors 18-20 which is virtually a short circuit. Only a small amount of the rf current flowing from source 12 through the source drain path of transistor 16 into tap 27 is coupled to the source drain paths of transistors 19 and 20, because of the low impedance source drain path of transistor 18.

With the source drain path of transistor 16 pinched off while the source drain paths of transistors 18-20 are biased into their triode regions, a substantially constant insertion loss subsists between source 12 and load 13 for the 0.1-20 gHz band of source 12; in the preferred embodiment the loss is at least 48 db. As the frequency of source 12 increases toward 20 gHz, the amount of isolation provided by the capacitive series, source drain path of transistor 16 decreases while the loss provided by the network including the source drain paths of transistors 18-20 and inductive transmission lines 23-26 increases. This is because capacitive impedance between the source and drain of the substantially constant capacitance transistor 16 decreases as frequency increases. The decrease in the capacitive impedance of transistor 16 is accompanied by an increase in the impedance of inductive transmission line 17 as frequency increases. This increase in the inductive reactance of the individual transmission line inductors 23-26 included in inductive transmission line 17 causes the attenuation of line 17 shunted by the resistive impedances of transistors 18-20 to increase with increasing frequency thus reducing the amount of rf power from the source 12 from reaching the load 13. At lower frequencies the reactance of inductive transmission line 17 is decreased and the attenuation of line 17 shunted by transistors 18-20 is reduced. However, at these low frequencies the isolation of pinched off series transistor 16 is high enough to offset the decreasing attenuation of inductive transmission line 17 and transistors 18-20, thereby maintaining high isolation from 0.1-20 gHz.

Figure 2:
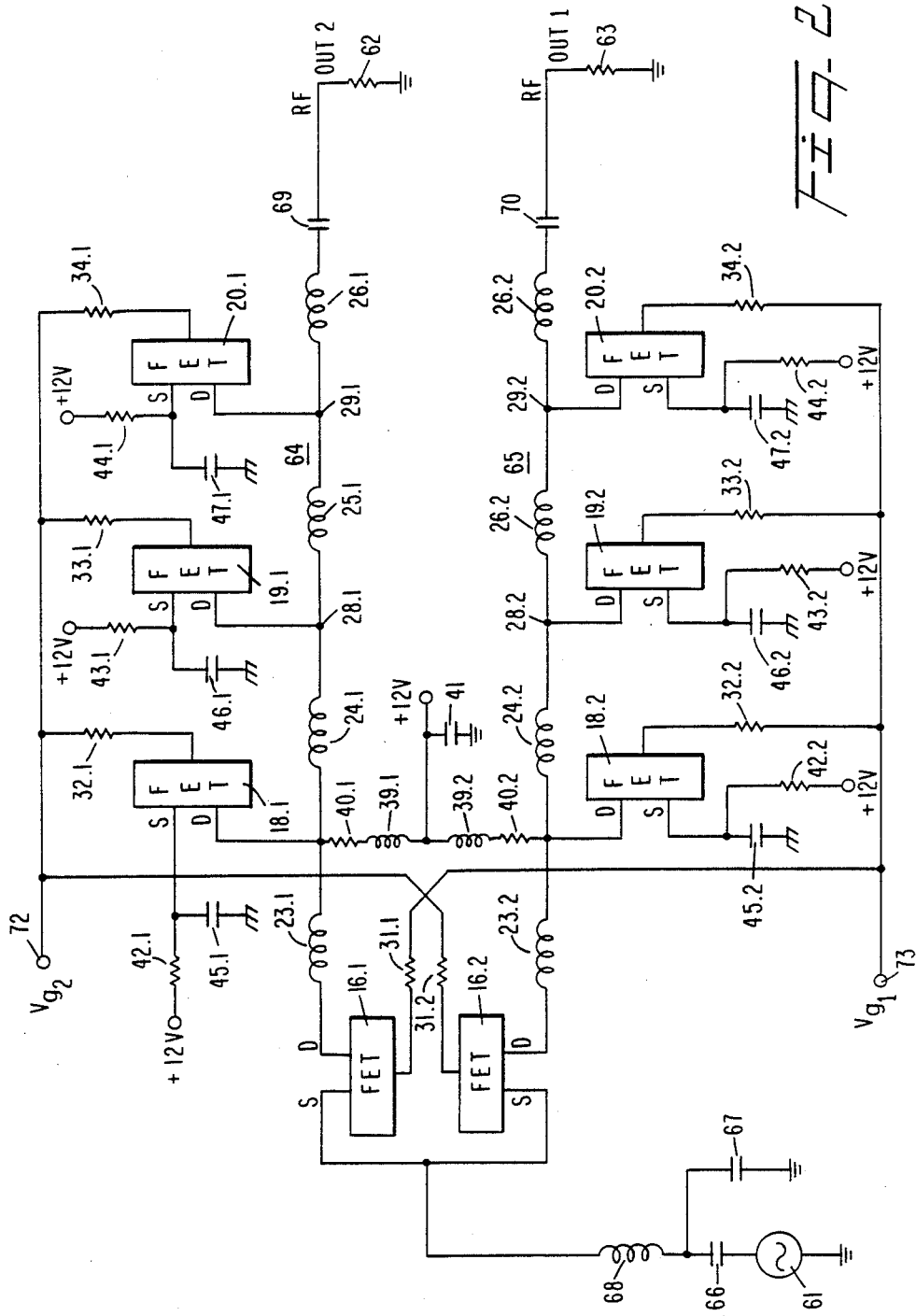
FIG. 2 is a circuit diagram of a high isolation single pole, double throw distributed switch in accordance with the invention.

A modification of the device illustrated in FIG. 1 is a single pole, double throw switch, as illustrated in FIG. 2, wherein rf energy from source 61 is selectively coupled to load 62 or 63 by way of switches 64 and 65, respectively. Again, source 61 includes a voltage generator and a source resistance (not shown). Switches 64 and 65 are essentially identical to each other and to switch 11. Elements of switch 64 and 65 corresponding with elements of switch 11 have corresponding reference numerals in the tens and units places, followed by a decimal point and the integer 1 or 2 for the elements of switches 64 and 65. Thus, for example, the shunt field effect transistors of switches 64 and 65, respectively bear the reference numerals 18.1-20.1 and 18.2-20.2.

The microwave signal of source 61 is applied in parallel to the source electrodes of field effect transistors 16.1 and 16.2 by an impedance matching network including shunt capacitor 67 and inductor 68. Loads 62 and 63 are connected to inductors 26.1 and 26.2 by series capacitors 69 and 70, respectively. In the preferred embodiment, capacitors 66, 69, and 70 are discrete components not included in the integrated circuit in which the switch and a driver for it are contained together with capacitor 67 and inductor 68.

To provide complementary operation of switches 64 and 65, positive voltages having different values are applied to terminals 72 and 73 by a driver circuit. The voltages at terminals 72 and 73, in the preferred embodiment, have a value of either +6 volts or +12 volts to selectively activate field effect transistors contained in switches 64 and 65 into either a pinched off, capacitive state or a conducting state with triode characteristics as described supra for FIG. 1. The voltages at terminals 72 and 73 are relative to the +12 volt bias applied to the source electrodes of transistors 18.1-20.1 and 18.2-20.2 via resistors 42.1-44.1 and 42.2-44.2. The control voltage at terminal 72 is applied in parallel to the gate electrodes of transistors 16.2 and 18.1-20.1, while the complementary control voltage at terminal 73 is applied in parallel to the gate electrodes of transistors 16.1 and 18.2-20.2. Thereby, transistors 16.1 and 18.2-20.2 are pinched off while transistors 16.2 and 18.1-20.1 are biased into their triode region of operation. Reverse conditions exist in response to complementary voltages being applied to terminals 72 and 73.

With transistors 16.2 and 18.1-20.1 biased into the triode region, the signal of source 61 is coupled to load 63 to the exclusion of load 62. The signal of source 61 is supplied through the low, resistive impedance source drain path of transistor 16.2 to the matched low pass filter including series inductors 23.2-26.2 and the capacitive source drain paths of transistors 18.2-20.2. The cut-off frequency of the low pass filter is greater than the highest frequency of source 61 to provide a low insertion loss (in the preferred embodiment less than 3 db) between source 61 and load 63. Conversely, the signal of source 61 is decoupled from load 62 by a network including the capacitive source drain path of transistor 16.1, inductive transmission lines 23.1-26.1 and the low resistive impedance source drain paths of transistors 18.1-20.1. The selective insertion of the series capacitive impedances of the source drain paths of transistors 16.1 and 16.2 in the selected decoupled path materially increases the isolation between microwave source 61 and the decoupled load at the lower end of the frequency range of source 12.

To couple rf source 61 to load 62 to the exclusion of load 63, the state of switches 64 and 65 are reversed by reversing the bias voltages applied to terminals 72 and 73, whereby a low impedance resistive path exists through the source drain path of transistor 16.1 while a low pass filter is formed by inductors 23.1–26.1 and the capacitive reactance of the source drain paths of transistors 18.1–20.1. This condition exists simultaneously with the source drain path transistor 16.2 having a capacitance impedance while a low resistive impedance exists between the source drain paths of transistors 18.2–20.2.

Figure 3:
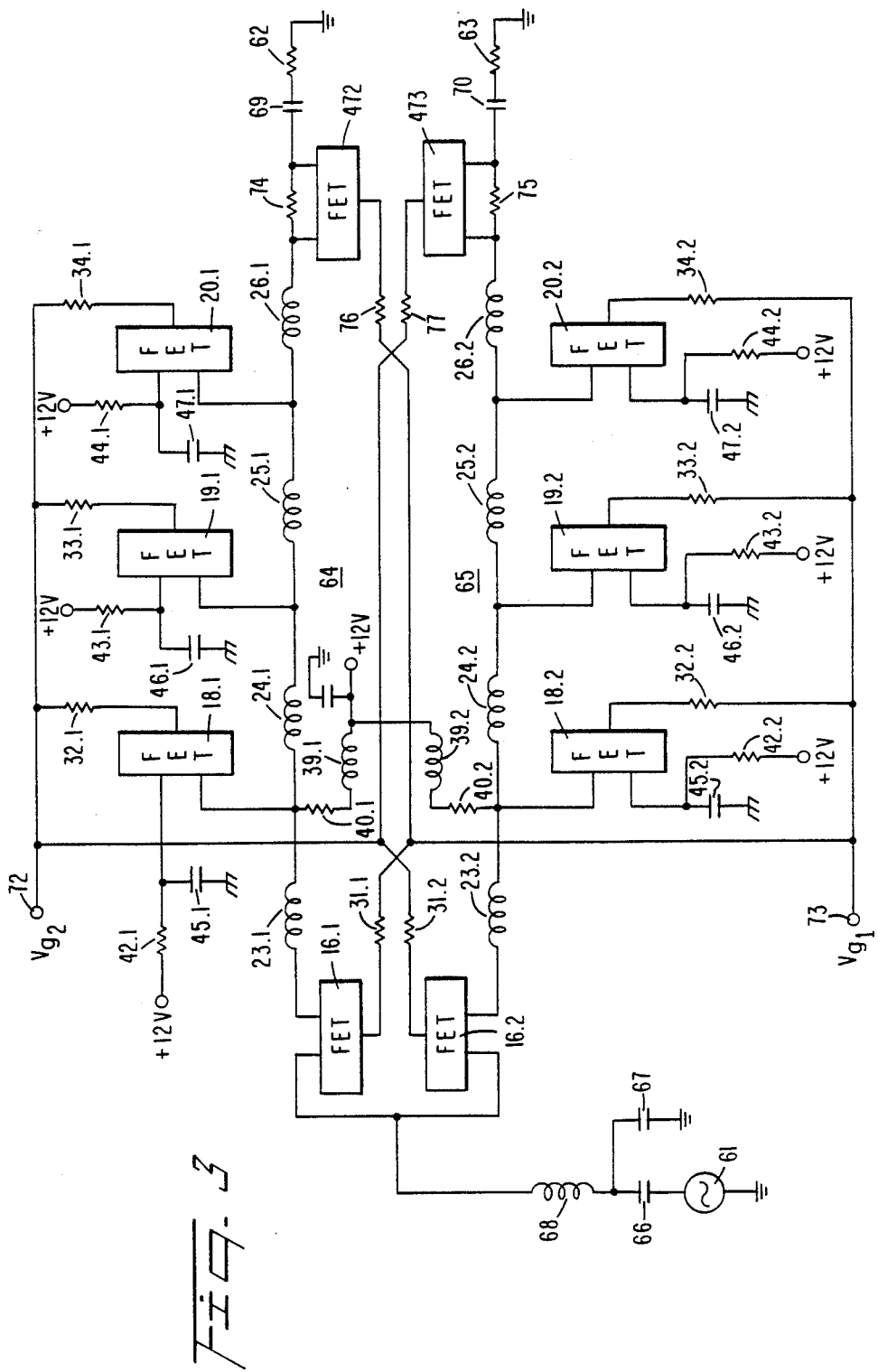
FIG. 3 is a circuit diagram of a matched non-reflective high isolation single pole, double throw distributed switch in accordance with the invention.

The switch of FIG. 2 has a tendency to provide a somewhat high voltage standing wave ratio (VSWR) at the decoupled or OFF port of the switch. This is because the output impedance of the OFF switch is the low resistance state of either of transistor 20.1 or 20.2 in series with inductor 26.1 or 26.2 respectively, resulting in an impedance which does not match loads 61 or 62 which are typically 50 ohms resistive. To overcome this disadvantage, the circuit of FIG. 2 is modified, as illustrated in FIG. 3, so that switches 64 and 65 include a second series switch, which when pinched off, inserts a 50 ohm resistive impedance between the switch and the load connected to the switch. Field effect transistors 472 and 473 are included in switches 64 and 65 so that the source drain paths thereof are respectively connected between inductive transmission line 26.1 and low impedance coupling capacitor 69 and between inductive transmission line 26.2 and low impedance coupling capacitor 70. The source drain paths of transistors 472 and 473 are respectively shunted by resistors 74 and 75, having values equal to the impedances of source 61 and resistive loads 62 and 63 to provide an impedance matched to the loads.

The gate electrodes of transistors 472 and 473 are respectively coupled to the control voltage at terminals 73 and 72 by resistors 76 and 77 so that the source drain paths of transistors 16.1 and 472 are simultaneously activated into the triode operating region while the source drain paths of transistors 16.2 and 473 are simultaneously pinched off. Conversely, while transistors 16.2 and 473 are simultaneously biased into their triode regions, transistors 16.1 and 472 are simultaneously pinched off.

While switch 64 is activated to pass the signal from source 61 to load 62 and switch 65 is OFF, the source drain paths of field effect transistors 16.1 and 472 are biased into their triode regions, the source drain paths of transistors 18.1–20.1 are pinched off, the source drain paths of transistors 16.2 and 473 are pinched off, and the source drain paths of transistors 18.2–20.2 are biased into their triode regions. At this time the impedance seen by source 61 is the characteristic impedance of the low pass filter including the inductive impedance of inductors 23.1–26.1 and the capacitance impedances of the source drain paths of transistors 18.1–20.1, in parallel with the network formed by the source drain capacitive impedance of field effect transistor 16.2 in series with the inductive impedance of inductor 23.2 that is connected to ground through the low resistance source drain impedance of transistor 18.2. The low pass filter is terminated by load 62 coupled to the low pass filter by the relatively small drain source resistance of transistor 472 which is biased into its triode region. By proper selection of the values of inductors 23.1, 23.2, 24.1, 25.1 and 26.1 and proper design of the pinch off state impedances of field effect transistors 16.1, 16.2, 23.1–26.1 and 23.2–26.2, source 61 is matched to terminated switches 64 and 65.

While switch 64 is ON and switch 65 is OFF, the impedance seen by load 62 looking back into switch 64 is the characteristic impedance of the matched low pass filter formed by inductors 23.1–26.1 and the shunt capacitance between the source drain electrodes of field effect transistors 18.1–20.1. Since the filter characteristic impedance, the source resistance 12 and the impedance of load 62 are equal, the load is matched. Because the internal, resistive source drain impedance of field effect transistor 472 when biased into the triode region is much lower than the resistance of resistor 74, the resistances of transistor 472 and resistor 74 can be effectively ignored. Simultaneously, the impedance seen by load 63, looking back into switch 65, comprises resistor 75, the inductance of inductor 26.2 and the very low resistive source drain impedance of field effect transistor 20.2. Load 63 is matched because (1) resistor 75 has approximately the same value as load 63, and (2) the series combination of inductor 26.2 and the shunt resistance of transistor 20.2 has a low impedance with respect to the load resistance. The switch of FIG. 3 is thus matched at all 3 ports regardless of which path is selected. The switches of FIGS. 1 and 2 are only matched when the referenced path is ON. The isolated or OFF ports of the switches of FIGS. 1 and 2 are not matched to their respective loads.

Each of the microwave switches of FIGS. 1–3 is preferably an integrated circuit structure on a substrate, as described infra in detail. Each switch is preferably on the same substrate as a low power driver for it, to maximize switching speed and minimize the required number of interconnections between the switch and its driver.

Figure 4:
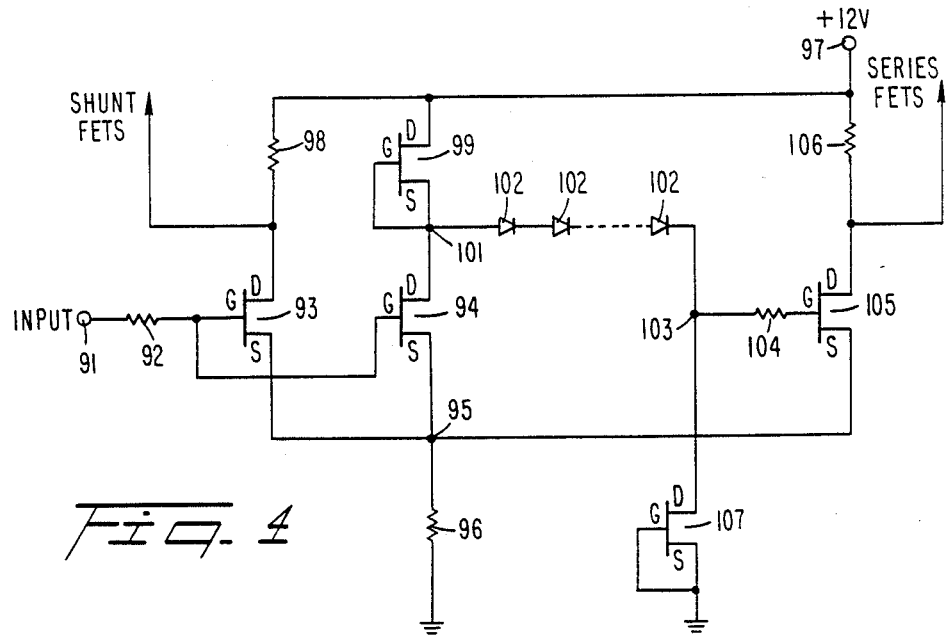
FIG. 4 is a circuit diagram of a driver for the circuits illustrated in FIGS. 1-3.

Reference is now made to FIG. 4 of the drawing wherein there is illustrated a schematic diagram of a preferred driver for the switches of FIGS. 1–3. The driver circuit is responsible to an external, bi-level pulse source which, in the preferred embodiment, has a value that varies between 0 and +5 volts, as derived from a TTL source.

The bi-level voltage from the external pulse source is applied to input terminal 91, thence in parallel via resistor 92 to the gate electrodes to field effect transistors 93 and 94 having source electrodes connected to terminal 95, in turn connected to ground through resistor 96. Field effect transistors 93 and 94 have drain electrodes connected to positive DC bias terminal 97 (preferably at +12 volts) via resistor 98 and field effect transistor 99. Transistor 99 effectively forms a current source between the drain of transistor 94 and power supply terminal 97 because the source and gate thereof are connected to each other.

Common terminal 101 between the drain of transistor 94 and the source of transistor 99 is connected via a string of seven series connected diodes 102 to terminal 103. (For convenience, only three of diodes 102 are specifically illustrated, with the understanding that four diodes are connected in seres where the dotted lines appear in the drawing.) All of diodes 102 are polarized in the same direction, with the diode in the string at the highest voltage having an anode connected to the common terminal for the drain of transistor 94 and the lowest voltage diode in the string having a cathode connected to terminal 103. Terminal 103 is connected to the gate of field effect transistor 105 having a source connected to terminal 95 and a drain connected via resistor 106 to power supply terminal 97. Terminal 103 is connected to ground via a current sink formed by drain and gate electrodes of transistor 107, having shorted source and gate electrodes.

Complementary voltages are applied to the gate electrodes of transistors 93 and 105 so that in response to a positive going transition at terminal 91, there is a tendency for negative and positive going transitions to occur at the source electrodes of transistors 93 and 105. Since the source electrodes of transistors 93, 94 and 105 have a common connection to terminal 95 the tendency for opposite going transitions at the source electrodes of transistors 93, 94 and 105 is overcome to balance the current in the transistors. The voltage at terminal 103 has basically the same wave shape as the voltages at the drains of transistors 93 and 105. The voltages at the drains of transistors 93 and 105 vary between the +6 volts and +12 volts in the preferred embodiment. The complementary voltages at the drains of transistors 93 and 105 are respectively applied to terminals 72 and 73 in both FIGS. 2 and 3, to control the operation of the single pole, double throw switches illustrated therein and to terminals 8 and 9 of the single pole, single throw switch illustrated in FIG. 1.

Reference is now made to FIGS. 5-7 of the drawings wherein the structure of field effect transistors 16, 16.1 and 16.2 is illustrated. Transistors 16 or 16.1 and 16.2 are formed on semi-insulating gallium arsenide substrate 111 having a thickness of about 100 micrometers. On bottom face 113 of substrate 111 is formed a gold ground plane 112. While substrate 111 is preferably formed of gallium arsenide because of its desirable semi-insulating properties, other substrates in which active semiconductor regions may be formed can also be employed. Similarly, any suitable metals can be employed for electrodes and the ground plane on substrate 111, although gold is the preferred material because of its known high performance characteristics. The gate electrode should be composed of a metal or metals that form a Schottky barrier junction with the active region. Such a metal system is titanium, tungsten gold.

Formed on top face 114 of substrate 111 are source, gate and drain electrodes 115, 116 and 117, respectively. Source and drain electrodes 115 and 117 form ohmic contacts with the portions of ion implanted active, GaAs semiconductor layer 201 on substrate 111 immediately beneath the electrodes. Layer 201 is formed directly on substrate 111; in the preferred embodiment the active layer has a resistivity of about 320 ohms per square. The active region formed by electrodes 115-117 and layer 201 is surrounded by electrically insulating proton isolation layer 202, formed by bombarding layer 201 with protons everywhere except at the sites where active region is desired.

Schottky barrier junctions are formed between gate electrode 116 and layer 201. The Schottky barriers in combination with ohmic contacts between layer 201 and drain 117 as well as source arms 124 and 125 form high speed Schottky diodes. A first Schottky diode includes arm 124, layer 201 and gate finger 132; a second diode includes drain stripe 117, layer 201 and gate finger 132. The first and second diodes are in series with each other. Third and fourth similar series connected Schottky diodes subsist between gate finger 133 and source arm 124 and between arm 124 and drain stripe 117. The first and second series connected Schottky diodes are in parallel with the third and fourth series connected Schottky diodes because the second and fourth diodes share drain stripe 117, while arms 124 and 125 are connected to each other by body 128. The bias between source and gate electrodes 115 and 116 determines whether the field effect transistors so formed have a resistive or capacitive impedance between the transistor source and drain electrodes.

As illustrated in FIG. 6, each of source and drain electrodes 115 and 116 includes a thin ohmic contact layer 203 that is deposited directly on active, ion implanted semiconductor layer 201. Covering each of layers 203 is metal layer 204, preferably an evaporated gold layer. On each of layers 204 is thicker plated gold deposit 205, typically having about the same thickness as ground plane 112, i.e., approximately 5 micrometers. Layers 203 and 204 of electrodes 115 and 117 are spaced and electrically insulated from each by $Si_3N_4$ passivation dielectric regions 206 covering the region of active layer 201 between electrodes 115 and 116 except where the layers cover buried metal fingers 132 and 133 of gate 116. To form Schottky barriers between gate fingers 132 and 133 and active layer 201 the gate fingers are preferably formed of a titanium, tungsten, gold alloy. Fingers 132 and 133 are deposited in the nadirs of notches 211 and 212 each having an arcuate section in layer 201 between electrodes 115 and 116 so the fingers contact layer 201 and are covered by regions 206.

As illustrated in FIG. 5, source electrode 115 includes arms 124 and 125, each comprising layers 203 and 204 as well as deposits 205; arms 124 and 125 respectively include parallel sides 126 and 127. Electrodes 115-117 are symmetrical about the longitudinal axis of drain 117, formed as an elongated gold strip having parallel edges separated from each other by 12.5 micrometers in the preferred embodiment. Arms 124 and 125 are connected to each other by body or base 128, from which extends stripe 129, having a common center line with the center line of the stripe forming drain 117. The cross sections of body 128 and stripe 129 are similar to those of arms 124 and 125, as illustrated in FIG. 6. Stripe 129 includes parallel, opposed edges spaced from each other in the preferred embodiment by 12.5 micrometers. Between the parallel sides of arms 124 and 125 is gap 131 in which are located gate fingers 132 and 133, as well as the end of the stripe forming drain 117. Fingers 132 and 133 are very narrow, each having a width of approximately 0.5 micrometer. Fingers 132 and 133 extend parallel to each other and to the parallel edges of the strip of drain 117 and edges 127 an 127 of arms 124 and 125. By providing a single drain stripe and a symmetrical arrangement of gate fingers 132 and 133 and arms 124 and 125, the switch arrangement of FIGS. 5-7 is capable of high frequency operation because there is a small, precise parasitic reactive impedance between source and drain electrodes 115 and 117 and the parasitic reactance to ground is minimized.

The bias voltage applied to fingers 132 and 133 controls the impedance of active layer 201 between source electrode 115 and drain electrode 117 (achieved by supplying a +12 volt bias to terminal 8 (FIG. 1) while terminal 35 (FIG. 1) is connected to a +12 volt DC supply) in accordance with the Schottky barrier field effect transistor mechanism. In response to a zero bias voltage being applied to fingers 132 and 133 relative to source arms 125 and 126 and drain stripe 117 the impedance of the conducting channel in layer 201 between stripe 117 and each of arms 124 and 125 is a resistance of about 4 ohms. The device is in its triode region, rather than saturated, because the drain to source voltage is small. With fingers 132 and 133 at zero voltage relative to drain stripe 117, gate-source Schottky junction barriers with region 201 from finger 132 to arm 124 and from finger 133 to arm 125 are zero biased as are gate-drain Schottky barrier junctions with region 201 from fingers 132 and 133 to stripe 117. Thereby parallel first and second resistive conducting regions subsist in layer 201. The zero forward bias voltage applied to gate fingers 132 and 133 relative to arms 124 and 125 does not require any current to be applied by the driver to fingers 132 and 133.

In response to a back bias voltage being applied to gate fingers 132 and 133, relative to drain stripe 117 and source arms 124 and 125, Schottky diodes between the fingers and the stripe 117 and the arms are back biased so that active layer 201 becomes a relatively small capacitor shunted by a relatively large resistance. At the frequency range of source 12 the pinched off capacitive impedance of layer 201 between drain stripe 117 and source arms 124 and 125 is relatively high to provide minimal AC coupling of the source to inductor 23. Because the diodes from fingers 132 and 133 to stripe 117, as well as arms 124 and 125 are all back biased, virtually no current flows from the driver to gate fingers 132 and 133.

As illustrated in FIGS. 5 and 7, fingers 132 and 133 forming gate 116 are connected to metal pads 138 and 139, on opposite sides of the stripe forming drain electrode 117. Pads 138 and 139 are outside gap 131 adjacent the sides of arms 124 and 125 opposite from body 128. Pads 138 and 139, formed of layers 203 and 204 as well as deposit 205 on active region 201, which forms resistive stripe 141, deposited on substrate face 114 between the pads. Stripe has a resistivity of about 320 ohms per square between pads 138 and 139 to provide a resistance of about 480 ohms between the pads. The stripe of drain 117 is formed as an air bridge 212 over resistive stripe 141. Air bridge 212 includes metal posts 211 in a manner well known to those skilled in the art so that stripe 141 is electrically insulated from the stripe of drain 117 by an air gap between them.

Pad 139 is connected by 2 kilohm resistive stripe 142 also formed in layer 201 to pad 143 to which is connected an output of the driver illustrated in FIG. 4. Because gate 116 draws no steady state current either at a zero forward bias voltage or a negative back bias voltage, the presence of resistive stripes 141 and 142 between pads 138, 139 and 139, 143 does not affect the magnitude of the steady state bias voltage applied to fingers 132 and 133. Thereby, fingers 132 and 133 are always at the same steady state voltages. This assures symmetry of operation.

In FIG. 8 is illustrated a top view of one of field effect transistors 472 and 473, FIG. 3. Transistors 72 and 73 are the same as transistors 16, 16.1 and 16.2, except that the stripe of drain electrode 117 extends beyond gate fingers 132 and 133 into gap 131. The most significant difference is the resistive regions 144 and 145 on active layer 201 extend between and are electrically connected to the parallel, opposite edges of the stripe forming drain 117 and sides 126 and 127 of arms 124 and 125. Regions 144 and 145 have the same resistivity, area and thickness, hence the same resistance, equal to twice the resistance of load 62 or 63, to provide a matching impedance for the loads since resistors formed by regions 144 and 145 are connected in parallel by body region 128.

In the preferred embodiment, each of regions 144 and 145 has a resistance of 100 ohms. Since regions 144 and 145 are electrically in parallel with each other, between drain stripe 117 and source arms 124 and 125, the effective resistance between source and drain electrodes 115 and 117 of the transistor illustrated in FIG. 8 is 50 ohms while a back bias voltage is applied to gate 116. Hence, the structure of FIG. 8 goes from a resistance of approximately 4 ohms to a resistance of 50 ohms, when switched between the triode and back biased states.

Figure 9:
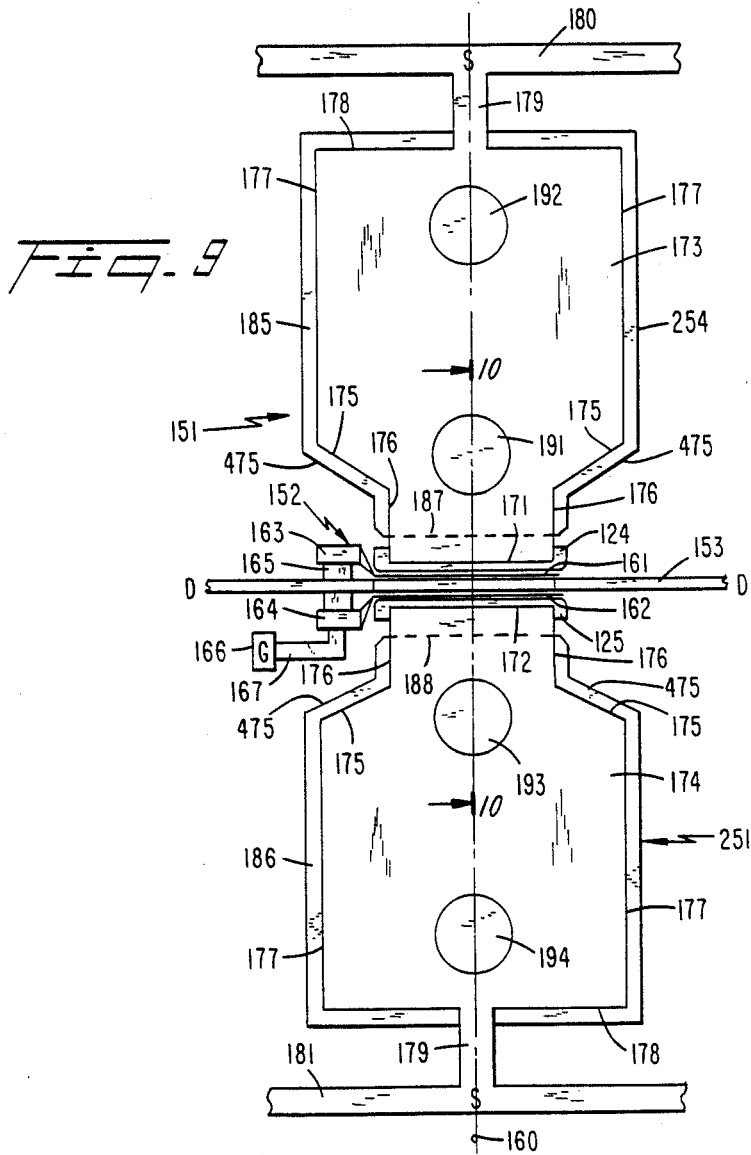
FIG. 9 is a top view of a shunt Schottky barrier field effect transistor utilized in any of the circuits of FIGS. 1-3.

Reference is now made to FIGS. 9 and 10 of the drawing wherein the structure of one of shunt field effect transistors 18–20, 18.1–20.1 and 18.2–20.2 is illustrated as including source, gate and drain electrodes 151, 152 and 153, as well as active layer 201. The entire shunt transistor configuration is symmetrical with the longitudinal center line of the strip forming drain electrode 153. Because source 151, drain 153, gate 152 and active layer 201 are formed on surface 114 of substrate 111 as field effect transistor devices in the manner illustrated in FIGS. 5 and 6 in the region where the drain and gate electrodes are located, details of this region are illustrated and described only where they differ from FIGS. 5 and 6. As such, gate 152 includes metal fingers 161 and 162, respectively connected to metal pads 163 and 164, in turn connected to each other by resistive stripe 165 under an air bridge for drain stripe 153. Pad 164 is connected to gate pad 166 via resistive stripe 167.

The stripe of drain 153 extends completely through, i.e., beyond the opposite ends, of the structure forming source 151 and fingers 161 and 162 of gate 152. The stripe forming drain 153 is a continuation of the stripe forming drain 117. Similarly, the drains forming the several shunt transistors, i.e., transistors 18–20, are continuations of the stripe of drain 153 illustrated in FIGS. 9 and 10. The stripe forming drains 117 and 153 is a transmission line which has sufficient inductance between transistors 16, 18–20 and transistor 72 or transistor 73, to form the inductive impedances of inductive transmission lines 23–26, 23.1–26.1 and 23.2–26.2, for the microwave frequencies of source 12.

The geometry, i.e., shape and size, of source electrode 151 is such that there is a relatively small shunt impedance with very repeatable, constant parasitic values between the source electrode and ground plane 112. Arms 173 and 174 of source 151, on opposite sides of the stripe of drain 153, are formed as relatively large metal rectangular pads above surface 114. Arms 173 and 174 are top metal plates of a capacitor having metal bottom plate 251 (FIG. 9) that is deposited directly on surface 114. Plate 251 is overlaid by dielectric silicon nitride ($Si_3N_4$) layer 253. Arms 173 and 174 are deposited on layer 253 so that the dielectric layer extends beyond the edges of the arms, except in the vicinity of active layer 201 and proton isolation layer 202 so that a dielectric subsists between the top and bottom metal plates of the capacitor. Source 151 is symmetrical with respect to center line 160 thereof which extends at a right angle to the center line of the strip forming drain 153.

The geometry of arms 173 and 174 is such that each of the longitudinal edges 177 and transverse edges 178 thereof is approximately twice as long as the length of sides 171 and 172 of the arms that are adjacent the stripe forming drain 153 and the fingers forming gate 152. Edges 171 and 172 of arms 173 and 174 contact arms 124 and 125 forming source electrode 151. From edges 171 and 172, arms 173 and 174 extend via air bridges 198 and 199 into contact with the upper faces of dielectric layer 253, which forms the dielectric of the capacitor between the metal plating forming arms 173, 174 and metal plating 251 forming pads on surface 114 having approximately the same size and shape as dielectric layer 253. Edges 401 and 402 of dielectric layer 253 cover the edges of metal layer 251 to contact substrate surface 114 in the region of gap 502 to assure that the metal layer is electrically insulated from active region 201 and arms 173 and 174.

Arms 173 and 174 and metal plating 251 have relatively large areas to enable a relatively large shunt capacitance to subsist between the arms and ground plane 112. The relatively large shunt capacitance minimizes the reactive impedance between arms 173 and 174 and ground plane 112 for the microwave frequencies of signal 12. To assist in achieving the relatively large capacitance, arms 173 and 174, as well as pads or layers 185, 186 and 253, include outwardly extending, sloping edges 175 and 475. Sloping edges 175 extend between edges 176 at right angels to edges 171 and 172, and edges 177, spaced farther from each other than edges 175; edges 177 extend parallel to edges 175. Edges 177 are connected to edges 178 that extend parallel to the longitudinal axis of the stripe defining drain 153.

Metal tabs 179, extending at right angles from edges 178, along center line 160, are connected to metal stripes 180 and 181 so that the stripes are directly connected to arms 173 and 174, respectively. Tabs 179 and stripes 180 and 181 are directly deposited on surface 114 of substrate 111. Stripes 180 and 181 extend parallel to each other and the longitudinal axis of the stripe forming drain 153. Stripes 180 of transistors 18–20 or 18.1–20.1 or 18.2–20.2 are aligned with each other and are directly connected to each other and to a power supply voltage; the same is true of stripes 181 for transistors 18–20 or 18.1–20.1 or 18.2–20.2.

Bottom capacitor plate 251 is deposited on face 114 of substrate 111 as metal pads having an area approximately similar in shape to arms 173 and 174. Dielectric layer 253 extends slightly beyond the edges of arms 173 and 174 as well as the metal pads to assure that the arms and pads are mutually insulated from each other. Pads 185 and 186 which are part of bottom capacitor plate 251 respectively include parallel edges 187 and 188, that extend parallel to the center line of the strip forming drain 153. Edges 187 and 188 are spaced from edges 171 and 172 by a sufficient distance to be spaced from active region 201 to prevent interaction between the pads, i.e., bottom plates of the capacitor, and the active region.

The metal layer 251 forming the bottom plates of the capacitor is connected to ground plane 112 by plated through or via holes 191–194, extending from the ground plane through substrate 111 into contact with the layer. Each of via holes 191–194 includes metal plated side wall 195 on a tapered hole etched into the ground plane side of substrate 111 and metal roof 196 that contacts metal layer 251. Via holes 191–194 are positioned on center line 160, with holes 191 and 192 connected to the metal pad under arm 173 being respectively proximate to and remote from edge 187; holes 193 and 194, connected to the pad under arm 174, are respectively proximate to and remote from edge 188. Via holes 191–194 provide a DC connection from ground plane 112 to pads 185 an 186, and a relatively low inductive impedance between the ground plane and pads for the frequencies of source 12. The two via holes connected between ground plane 112 and the metal pads are essentially in parallel with each other to assist in reducing the microwave frequency inductive impedance between the ground plane and pads.

FIG. 11 is an equivalent circuit diagram of the structure illustrated in FIGS. 9 and 10. Drain electrode 301 and gate electrode 302 respectively correspond with stripes 153 and pad 166 while resistor 303 corresponds with resistive stripe 167. Source electrode 304 corresponds with strips 180 and 181, which are connected to each other, as described infra in connection with FIG. 12. In addition, source terminal includes tabs 179 and a significant portion of arms 173 and 174. The variable impedance of active layer 201 (as illustrated in FIGS. 6 and 10) between the stripe of drain 153 and the portion of the metal plating forming arms 173 and 174 of source 151 is illustrated in FIG. 11 by field effect device 305. The capacitance formed between arms 173 and 174 and the pads formed by layer 251 beneath the arms, as well as dielectric layer 253, is represented in FIG. 11 by capacitor 306. Inductor 307, connected in series with capacitor 306, is formed by metal plated walls 195 of via holes 191–194. Inductor 307 is connected to ground terminal 308, which constitutes ground plane 112.

Figure 13:
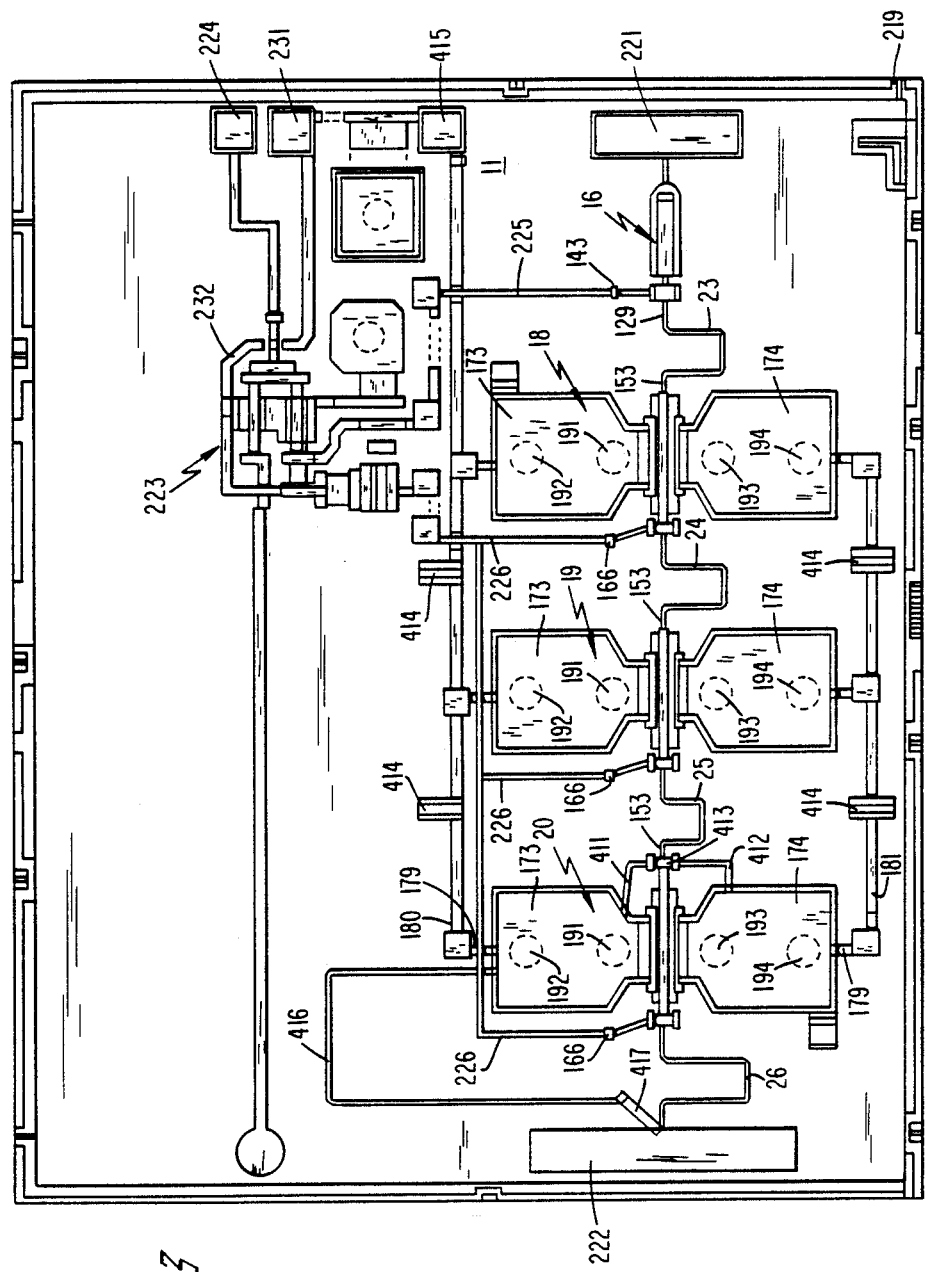
FIG. 13 is a top view of a monolithic microwave integrated circuit structure containing the circuit illustrated in FIG. 1.

Reference is now made to FIG. 13 of the drawing wherein the stripline circuit topology of substrate 111 containing the single pole, single throw switch of FIG. 1 and the driver of FIG. 4, is illustrated. In FIG. 13 series field effect transistor 16 is configured in the same manner as the device illustrated in FIGS. 5–7, while shunt field effect transistors 18–20 are configured in the same manner as illustrated in FIGS. 10 and 11. Inductors 23–26, connecting transistors 16 and 18–20 with each other and to capacitor 15, are configured on substrate 111 as U-shaped microstrip transmission lines having lengths and geometry determining the value of each inductance. Adjacent pairs of transistors 16 and 18–20 are spaced from each other by appreciable fractions of one quarter of a wavelength of the highest frequency handled by switch 11, so that transistors 16 and 18–20 are spaced from each other along the inductive strips by a line length approaching a quarter wavelength at the highest frequency of microwave source 12. Such spacing helps to increase the isolation between source 12 and load 13 while switch 11 is off, i.e., while field effect transistors 18–20 are operating in a triode, forward biased condition and transistor 16 is back biased so that the source drain impedance thereof is capacitive.

Arms 173 and 174 of shunt transistor 20 are connected together by metal strips 411 and 412, connected to each other by resistor 413, which passes under an air bridge in the stripe forming inductor 25. DC power supply pad 415, at +12 volts DC, is connected to metal arms 173 and 174 of transistors 18–20 via strips 180, 411, 412 and 181, as well as resistors 413 and 414. Resistors 414, in strips 180 and 181, reduce the Q of a resonant circuit that otherwise has a tendency to be formed by the parasitic inductance and capacitance of strips 180 and 181; the Q reduction prevents degradation of the 0.1–20 gHz ON insertion loss of switch 11. Resistors 413 and 414 do not affect the bias voltages of source arms 173 and 174 of transistors 18–20 since the transistors do not draw power supply current in either of the states at which they are biased. The drains of transistors 16 and 18–20 are biased by the DC voltage applied to arm 173 of transistor 20 by virtue of the DC connection from arm 173 of transistor 20 via metal stripe 416 and resistor 417 to the metal strip forming inductor 26.

Formed on substrate 111 are metal pads 221 and 222, respectively forming elements in an input and output matching network, and driver 223, having a configuration determined by the circuit diagram of FIG. 4. Driver 223 is coupled via pad 224 to an external pulse source to derive the bi-level +6 and +12 volt levels that are coupled to gate pads 143 and 166 by stripes 225 and 226. Power supply voltages are fed to the active elements of driver 223 and transistors 16 and 18-20 by connections established to pads 231, thence to the electrodes of the active elements by way of stripe 232.

In view of the detailed description of transistors 16 and 18-20 in conjunction with FIGS. 6-11, no further description of the transistors is necessary in conjunction with FIG. 13. The remaining elements formed on substrate 111 are conventional and need no further description. A preferred embodiment of the device actually built as a single pole, double throw switch was formed to meet the performance criteria set forth in the portion of this specification labelled "Background Art".

While there have been described and illustrated several specific embodiments of the invention, it will be clear that variations in the details of the embodiments specifically illustrated and described may be made without departing from the true spirit and scope of the invention as defined in the appended claims.

What is claimed is:

1. A wide frequency band switch for selectively supplying a microwave signal to a load comprising:
a first field effect device having a source drain path in series between a source of the signal and the load; inductive transmission line means in series with the source drain path of the first field effect device between the signal source and the load, said inductive transmission line means including N taps, where N is an integer greater than 1; N second field effect devices, the kth second field effect device having a shunt source drain path connected to tap k, where k is selectively every value of N; and means for selectively biasing the source drain paths of said first and second field effect devices so (1) during a first time interval the source drain paths of the first device and the N second devices respectively have first and second impedance states, and (2) during a second time interval the source drain paths of said first device and the N second devices respectively have said second and first impedance states, the first impedance state being a low resistive impedance, the second impedance state being a high capacitive impedance having a magnitude approximately on the order of magnitude of the impedance of the inductive transmission line means for frequencies of the microwave signal, whereby during the first time interval the capacitive impedances of the N second field effect devices and the inductive transmission line means form a matched low pass filter having a cut off frequency in excess of the highest frequency in the band so that the signal from the source is coupled through the first field effect device via the matched low pass filter to a load, and during the second time interval the N second field effect devices shunt current of the source flowing in the inductive transmission line means away from the load.

2. The switch of claim 1 wherein the signal is selectively supplied to one of M loads, where M is an integer greater than 1, and further comprising M of said switches connected to be driven in parallel by the source of the signal, the qth one of said M switches being connected to the qth one of the M loads, where q is selectively every integer from 1 to M, said biasing means including means for respectively biasing at any one time the source drain paths of the first and second devices of only one of switches q into the first and second impedance states respectively, while biasing the source drain paths of the first and second devices of all other switches q into the second and first impedance states respectively.

3. The switch of claim 2 wherein the source drain path of the first field effect device of switch q is connected between the inductive transmission line means of switch q and the signal source.

4. The switch of claim 3 wherein switch q further includes a third field effect device having a source drain path connected in series between the inductive transmission line means of switch q and load q, the means for biasing being connected to the third device to activate the source drain path of the third field effect device of switch q into the first and second states simultaneously with activating the source drain path of the first field effect device of switch q into the first and second states.

5. The switch of claim 1 wherein each of the field effect devices includes a Schottky barrier and a gate electrode responsive to the means for biasing, the means for biasing being connected to the gate electrodes of the field effect devices so they are biased into the triode region of operation while activated to the first state.

6. The switch of claim 5 wherein the means for biasing supplies the gate electrodes with a signal that pinches off the source drain channels to cause the source drain path impedances to be capacitive while the field effect devices are activated to the second state.

7. The switch of claim 1 wherein the inductive transmission line means has a distance between adjacent taps which approximates $\lambda/4$, where $\lambda$ is the wavelength of the highest frequency in the band.

8. The switch of claim 1 wherein each of said devices is a stripline structure on a common nonconducting substrate having first and second opposed faces, a metal ground plane conductor on said first face, each of said devices including: an active region on the second face, source, gate and drain electrodes contacting the active region so that the source and drain electrodes form ohmic contacts with the active region, a Schottky barrier junction being formed between the gate electrode and the active region, the source electrode including first and second arms respectively having first and second spaced elongated sides extending in generally the same direction, the drain electrode including an elongated strip extending between the first and second spaced elongated sides, the strip including first and second elongated edges extending in generally the same direction as the elongated sides, the gate electrode including first and second elongated fingers extending in generally the same direction as the elongated sides and edges, the first finger being between the first side and first edge, the second finger being between the second side and second edge, first and second portions of the active region respectively extending between the first and second arms and the strip to form first and second semiconductor channels, the first channel being between the first side and first edge, the second channel being between the second side and second edge, the first and second channels having impedances controlled by the voltage applied to the gate electrode relative to the source electrode so that in response to the gate electrode being forward and back biased relative to the source electrode the first and second channels respectively have resistive and capacitive impedances; the inductive transmission line means including metal strip means on said second face connecting drains of said first and N second devices together.

9. The switch of claim 8 wherein the source electrode of said first device includes a body region connecting the first and second arms together and to another elongated strip, the arms and another elongated strip extending in opposite directions away from the body region, the strip included in the drain extending beyond a region between the arms away from the body region.

10. The switch of claim 9 wherein the gate electrode of the first device includes first and second pad regions respectively connected to the first and second fingers, and contact means for electrically connecting the first and second pad regions together.

11. The switch of claim 8 wherein the drain strip of each of the devices includes an elongated center line, the gate electrode of each of the devices including first and second metal pad regions respectively connected to the first and second fingers, each of the devices including contact means for electrically connecting the first and second pad regions together; the arms, fingers and pads of each of the devices being symmetrical with respect to said center line.

12. The switch of claim 11 wherein the strip of the drain of each second device extends along the center line beyond the ends of the first and second spaced elongated sides.

13. The switch of claim 12 wherein each arm of each second device includes a portion extending away from the center line, a metal stripe connected to each arm portion at a location remote from the center line.

14. The switch of claim 13 wherein each second device includes first and second metal pads on the second face respectively below first and second dielectric regions and below said portions of the first and second arms so that the first and second metal pads are capacitively coupled to said portions of the first and second arms via the first and second dielectric regions, and means for electrically connecting the first and second pads to the ground plane.

15. The switch of claim 14 wherein the means for connecting the first and second pads to the ground plane respectively comprises first and second metal vias extending through the substrate between the ground plane and the first and second pads.

16. The switch of claim 1 wherein each of said devices is a stripline structure on a common nonconducting substrate having first and second opposed faces, a metal ground plane conductor on said first face, each of said shunt devices including:

an active semicondutor region on the second face, a control electrode on said region forming a Schottky barrier junction with the region, and another electrode making ohmic contact with said region, a capacitor in series between said metal ground plane conductor and said another electrode, said capacitor including dielectric means sandwiched between first and second metal layers, said another electrode including the second metal layer, the first metal layer being on the second face and electrically connected to the metal ground plane conductor on the first face by metal plating of via holes extending through the substrate between said faces, the metal plating of the via holes forming an inductive impedance for microwave signals, said inductive impedance being in series with said capacitor between the ground plane and another electrode.

17. The switch of claim 16 wherein each of said shunt devices further comprises a further electrode making ohmic contact with said region, said control electrode being between said another and further electrodes.

18. The switch of claim 17 wherein said control and another electrodes of each of said shunt devices both include first and second segments symmetrically positioned on opposite sides of a longitudinal axis of said further electrode; said dielectric means, metal layers and via holes being symmetrical with respect to said axis and a further axis at right angles to the longitudinal axis of the further electrode.

* * * * *